United States Patent
Rofougaran et al.

(10) Patent No.: US 8,145,140 B2
(45) Date of Patent: Mar. 27, 2012

(54) METHOD AND SYSTEM FOR CLOCKING FM TRANSMIT, FM RECEIVE, AND NEAR FIELD COMMUNICATION FUNCTIONS USING DDFS

(75) Inventors: Ahmadreza Rofougaran, Newport Coast, CA (US); Maryam Rofougaran, Rancho Palos Verde, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/206,240

(22) Filed: Aug. 9, 2011

(65) Prior Publication Data

US 2011/0294419 A1 Dec. 1, 2011

Related U.S. Application Data

(63) Continuation of application No. 11/754,705, filed on May 29, 2007, now Pat. No. 7,995,971.

(60) Provisional application No. 60/895,698, filed on Mar. 19, 2007.

(51) Int. Cl.
H04B 1/40 (2006.01)

(52) U.S. Cl. .................... 455/76; 455/41.1; 455/41.2

(58) Field of Classification Search .................... None
See application file for complete search history.

(56) References Cited

U.S. PATENT DOCUMENTS

| | | | |
|---|---|---|---|
| 7,620,429 B1 * | 11/2009 | Frerking et al. | 455/569.1 |
| 2004/0176058 A1 * | 9/2004 | Johnson | 455/147 |
| 2005/0090208 A1 * | 4/2005 | Liao | 455/112 |
| 2005/0117071 A1 * | 6/2005 | Johnson | 348/729 |

* cited by examiner

Primary Examiner — Zhiyu Lu
(74) Attorney, Agent, or Firm — Farjami & Farjami LLP

(57) ABSTRACT

Methods and systems for clocking FM transmit, FM receive and near field communication functions using DDFS are disclosed. Aspects of one method may include generating a Bluetooth signal that may comprise, for example, I and Q components, or Bluetooth local oscillator (LO) signals, for use in Bluetooth communication. One of the two Bluetooth LO signals may then be used by a DDFS to generate I and Q LO signals for FM reception and/or transmission. One of the I and Q LO signals for FM communication may be used by another DDFS to generate at least one LO signal for near field communication (NFC) transmission and/or reception. While the Bluetooth LO signal may vary in frequency as Bluetooth frequency hopping occurs, the FM LO signals may remain constant for a specific channel frequency. Similarly, while the FM LO signals may be changed to tune to different FM channels, the NFC LO signals may remain at a constant frequency.

20 Claims, 6 Drawing Sheets

METHOD AND SYSTEM FOR CLOCKING FM TRANSMIT, FM RECEIVE, AND NEAR FIELD COMMUNICATION FUNCTIONS USING DDFS

CROSS-REFERENCE TO RELATED APPLICATIONS/INCORPORATION BY REFERENCE

This patent application is a continuation of U.S. patent application Ser. No. 11/754,705 filed on May 29, 2007. This application makes reference to, claims priority to, and claims benefit of U.S. Provisional Application Ser. No. 60/895,698 filed on Mar. 19, 2007.

This application also makes reference to:
U.S. patent application Ser. No. 11/754,481, filed on May 29, 2007;
U.S. patent application Ser. No. 11/754,460, filed on May 29, 2007;
U.S. patent application Ser. No. 11/754,581, filed on May 29, 2007;
U.S. patent application Ser. No. 11/754,621, filed on May 29, 2007;
U.S. patent application Ser. No. 11/754,490, filed on May 29, 2007;
U.S. patent application Ser. No. 11/754,708, filed on May 29, 2007;
U.S. patent application Ser. No. 11/754,768, filed on May 29, 2007;
U.S. patent application Ser. No. 11/754,600, filed on May 29, 2007;
U.S. patent application Ser. No. 11/754,407, filed on May 29, 2007; and
U.S. patent application Ser. No. 11/754,438, filed on May 29, 2007.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for clocking FM transmit, FM receive and near field communication functions using direct digital frequency synthesizers (DDFSs).

BACKGROUND OF THE INVENTION

Mobile terminals that support audio applications are becoming increasingly popular and, consequently, there is a growing demand for various audio communications applications. For example, some users may utilize Bluetooth-enabled devices, such as headphones and/or speakers, to allow them to communicate audio data with their wireless handset while freeing them to perform other activities. Other users may have portable electronic devices that may enable them to play stored audio content and/or receive audio content via FM broadcast communication, for example. Other users may use mobile terminals that have near field communication (NFC) capability.

Near field communication (NFC) is a communication technology that enables wireless communication devices, such as cellular telephones, SmartPhones, and personal digital assistants (PDAs) to establish peer-to-peer (P2P) networks. NFC may enable electronic devices to exchange data and/or initiate applications automatically when they are brought in close proximity, for example ranging from touching, or 0 cm, to a distance of about 20 cm. NFC may enable downloading of images stored in a digital camera, to a personal computer, or downloading of audio and/or video entertainment to MP3 devices, or downloading of data stored in a SmartPhone to a personal computer, or other wireless device, for example. NFC may be compatible with smart card technologies and may also be utilized to enable purchase of goods and services.

Near Field Communication (NFC) is a low speed communication protocol, which may be used, for example, to set up a Bluetooth communication link between two Bluetooth enabled devices by simply touching these two device to initiate a connection to exchange the parameters of the Bluetooth communication. A Bluetooth communication session may be established as a second step of this procedure without any human intervention. Once the communication session is established, the devices may be moved away from each other but the communication may continue via the Bluetooth communication session that was established previously. The same procedure may be used to establish a wireless link, for example, Bluetooth, or Wi-Fi, between two laptops or consumer electronics devices like TVs, laptop computers, PDAs, mobile phones, and/or SmartPhones.

The NFC protocol is based on a wireless interface in which there are two parties to the communication. Accordingly, the protocol may be referred to as a peer-to-peer communication protocol. The NFC protocol may be utilized to establish wireless network connections between network appliances and consumer electronics devices. The NFC interfaces operate in the unregulated RF band of 13.56 MHz. This means that no restrictions are applied and no licenses are required for the use of NFC devices in this RF band. Of course, each country imposes certain limitations on the electromagnetic emissions in this RF band. These limitations mean that, in practice, the distance at which the devices may connect with each other is restricted and this distance may vary from country to country. Operating distances of 0~20 cm may be generally utilized for NEC. The bit rate=(Dxfc)/128, where $D=2^N$ and N=0 to 6. Data may be Manchester encoded using ASK modulation.

As may be the case with the devices sharing a single RF band, the communication is half-duplex. The devices may implement a "listen before talk" policy, in which a device first listens on the carrier frequency and start transmitting a signal only if no other transmitting device is detected. The NFC protocol distinguishes between an initiator and a target of the communication. Any device may be either an Initiator or a target. The initiator is the device that initiates and controls the exchange of data. The target is the device that answers the request from the Initiator. The NFC protocol also distinguishes between two modes of operation, namely, an active mode and a passive mode. NFC compliant devices may support both communication modes. In the active mode of communication, the initiator and target devices may generate their own RF field to carry the data. In the passive mode of communication, only one device may generate the RF field while the other device uses load modulation to transfer the data. The NEC protocol specifies that the Initiator is the device responsible to generate the RF field.

Communication using NFC protocol may be desirable since it provides some features that may not be found in other general-purpose protocols. First of all, it is a very short-range protocol. It supports communication at distances measured in centimeters. The devices may have to be touched or almost touched to establish the link between them. This has some important consequences. The devices may rely on the protocol to be inherently secured since the devices must be placed very close to each other. It is easy to control whether the two devices communicate by simply placing them next to each other or keeping them apart. The procedure utilized for establishing the protocol is inherently familiar to people, since if it is desirable to have two devices communicate, the two devices may be brought with range, of the order of centimeters, of each other. This allows for the establishment of a network connection between the devices to be completely automated and transparent. The whole process may appear as though the devices recognize each other by touch and connect to each other once touching occurs.

Another important feature of the NFC protocol is the support for the passive mode of communication. This is very important for the battery-powered devices since conservation of power may be a high priority. The NFC protocol allows such a device, like a mobile phone, to operate in a power-saving mode, namely, the passive mode of NEC. This mode does not require both devices to generate the RF field and allows the complete communication to be powered from one side only. Of course, the device itself will still need to be powered internally but it does not have to "waste" the battery on powering the RF communication interface.

Additionally, the protocol may be used in conjunction with other protocols to select devices and automate connection set-up. Parameters of other wireless protocols may be exchanged allowing for automated set-up of other, SNF longer-range connections. Using longer-range protocols like Bluetooth or Wireless Ethernet may require selecting the correct device out of the multitude of devices in the range and providing the right parameters for the connection. Using NEC may require the touch of one device to another.

However, collocating several mobile applications in a single mobile terminal may lead to some difficulties. For example, the various applications may operate in different frequency spectrums, and therefore may need different oscillator circuits. Support for the various oscillators may require extra power, which is already a scarce resource for a mobile device, as well as additional device count and related layout real estate. An output clock signal from an oscillator may pick up interfering signals from other clock signals from other oscillators.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for clocking FM transmit, FM receive and near field communication functions using DDFSs, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for clocking FM transmit, FM receive and near field communication functions using DDFSs. Aspects of the method may comprise generating a Bluetooth signal that comprises I and Q components for use in Bluetooth communication. These I and Q components may be referred to as Bluetooth local oscillator (LO) signals. One of the two Bluetooth LO signals may then be used by a DDFS to generate FM radio I and Q LO signals for FM radio reception and/or transmission. The Bluetooth LO signal may be kept at the same frequency, or reduced in frequency, for use in clocking the DDFS. One of the FM I and Q LO signals may be used by another DDFS to generate at least one LO signal for near field communication (NFC) transmission and/or reception. The FM LO signal may be kept at the same frequency, or reduced in frequency, for use in clocking this DDFS.

The outputs of each DDFS may be a constant frequency while the inputs to each DDFS may vary in frequency. For example, while the Bluetooth LO signal may vary in frequency as Bluetooth frequency hopping occurs, the FM LO signals may remain constant for a specific channel frequency. Similarly, while the FM LO signals may be changed to tune to different FM radio channels, the NFC LO signals may remain at a constant frequency. For example, while the Bluetooth LO signal may vary in frequency as Bluetooth frequency hopping occurs, the FM LO signals may remain constant for a specific channel frequency. Similarly, while the FM LO signals may be changed to tune to different FM radio channels, the NFC LO signals may remain at a constant frequency.

Figure 1:
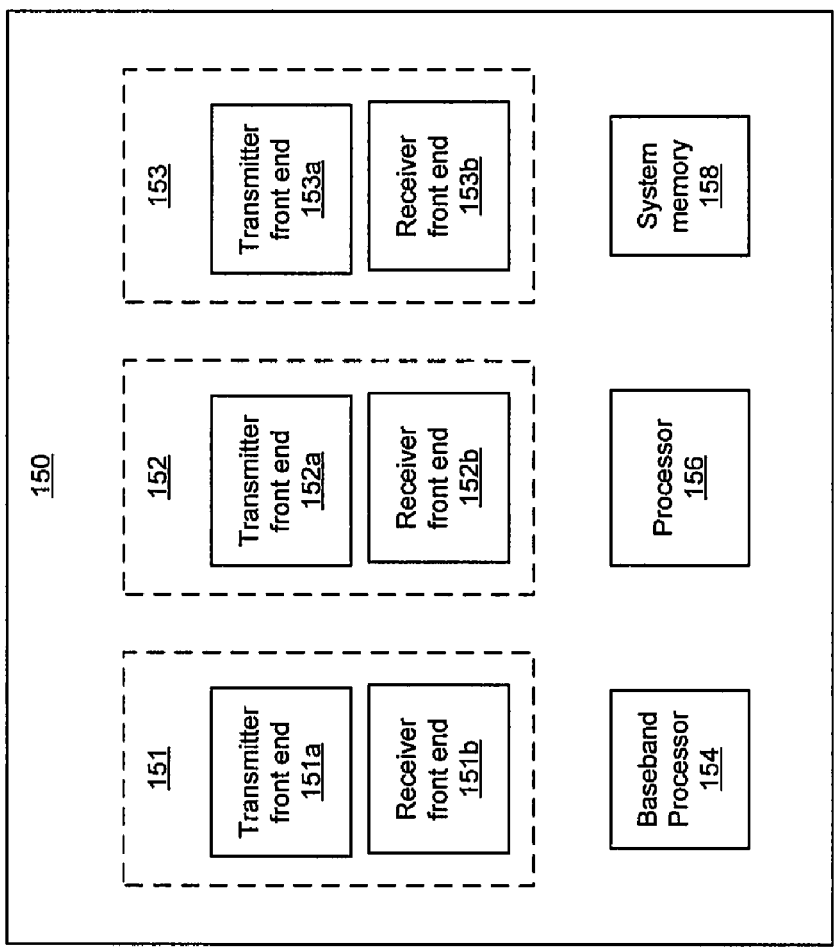
FIG. 1 is a block diagram of an exemplary system for wireless communication using a plurality of communication protocols, which may be utilized in connection with an embodiment of the invention.

FIG. 1 is a block diagram of an exemplary system for wireless communication using a plurality of communication protocols, which may be utilized in connection with an embodiment of the invention. Referring to FIG. 1, there is shown a mobile terminal 150 comprising a plurality of transceivers 151, 152, and 153, a baseband processor 154, a processor 156, and system memory 158. The transceivers 151, 152, and 153 may each comprise a transmitter front end 151*a*, 152*a*, 153*a*, respectively, and a receiver front end 151*b*, 152*b*, 153*b*, respectively.

The transmitter front ends 151a, 152a, and 153a may comprise suitable logic, circuitry, and/or code that may be adapted to process and transmit RF signals. The antennas that may be used to transmit the signals are not shown. The transmitter front ends 151a, 152a, and 153a may be communicated baseband signals to be transmitted from a baseband processor, such as, for example, the baseband processor 154. The signals may then be, for example, filtered, amplified, upconverted, and/or modulated for transmission. The baseband signal may be analog or digital depending on the functionality of the transmitter front end 151a, 152a, or 153a and the baseband processor 154.

The receiver front ends 151b, 152b, and 153b may comprise suitable logic, circuitry, and/or code that may be adapted to receive and process RF signals. The antennas that may be used to receive the signals are not shown. The receiver front ends 151b, 152b, and 153b may amplify, filter, downconvert, and/or demodulate the received signals to generate a baseband signal. The baseband signal may be analog or digital depending on the functionality of the receiver front end 151b, 152b, or 153b and the baseband processor 154.

Although the baseband processor 154 may be depicted as a single block, the invention need not be so limited. Accordingly, other embodiments of the invention may comprise a plurality of baseband processors for processing signals to and/or from the transceivers 151, 152, and 153.

The baseband processor 154 may comprise suitable logic, circuitry, and/or code that may be adapted to process received baseband signals from the receiver front ends 151b, 152b, and 153b. The baseband processor 154 also may comprise suitable logic, circuitry, and/or code that may be adapted to process a baseband signal for communication to the transmitter front ends 151a, 152a, and 153a.

The processor 156 may comprise suitable logic, circuitry, and/or code that may be adapted to control the operations of the transceivers 151, 152, and 153 and/or the baseband processor 154. For example, the processor 156 may be utilized to update and/or modify programmable parameters and/or values in a plurality of components, devices, and/or processing elements in the transceivers 151, 152, and 153 and/or the baseband processor 154. Control and/or data information may also be transferred to and/or from another controller and/or processor in the mobile terminal 150 to the processor 156. Similarly, the processor 156 may transfer control and/or data information to another controller and/or processor in the mobile terminal 150.

The processor 156 may utilize the received control and/or data information to determine a mode of operation for the transceivers 151, 152, and/or 153. For example, the processor 156 may control each of the receiver front ends 151b, 152b, and 153b to receive RF signals at a specific frequency. Similarly, the processor 156 may control each of the transmitter front ends 151a, 152a, and 153a to transmit RF signals at a specific frequency. The processor 156 may also adjust a specific gain for a variable gain amplifier, and/or adjust filtering characteristics for a filter. Moreover, a specific frequency selected and/or parameters needed to calculate the specific frequency, and/or the specific gain value and/or the parameters needed to calculate the specific gain, may be stored in the system memory 158 via the controller/processor 156. This information stored in system memory 158 may be transferred to the receiver front end 152 from the system memory 158 via the controller/processor 156. The system memory 158 may comprise suitable logic, circuitry, and/or code that may be adapted to store a plurality of control and/or data information, including parameters needed to calculate frequencies and/or gain, and/or the frequency value and/or gain value.

Figure 2:
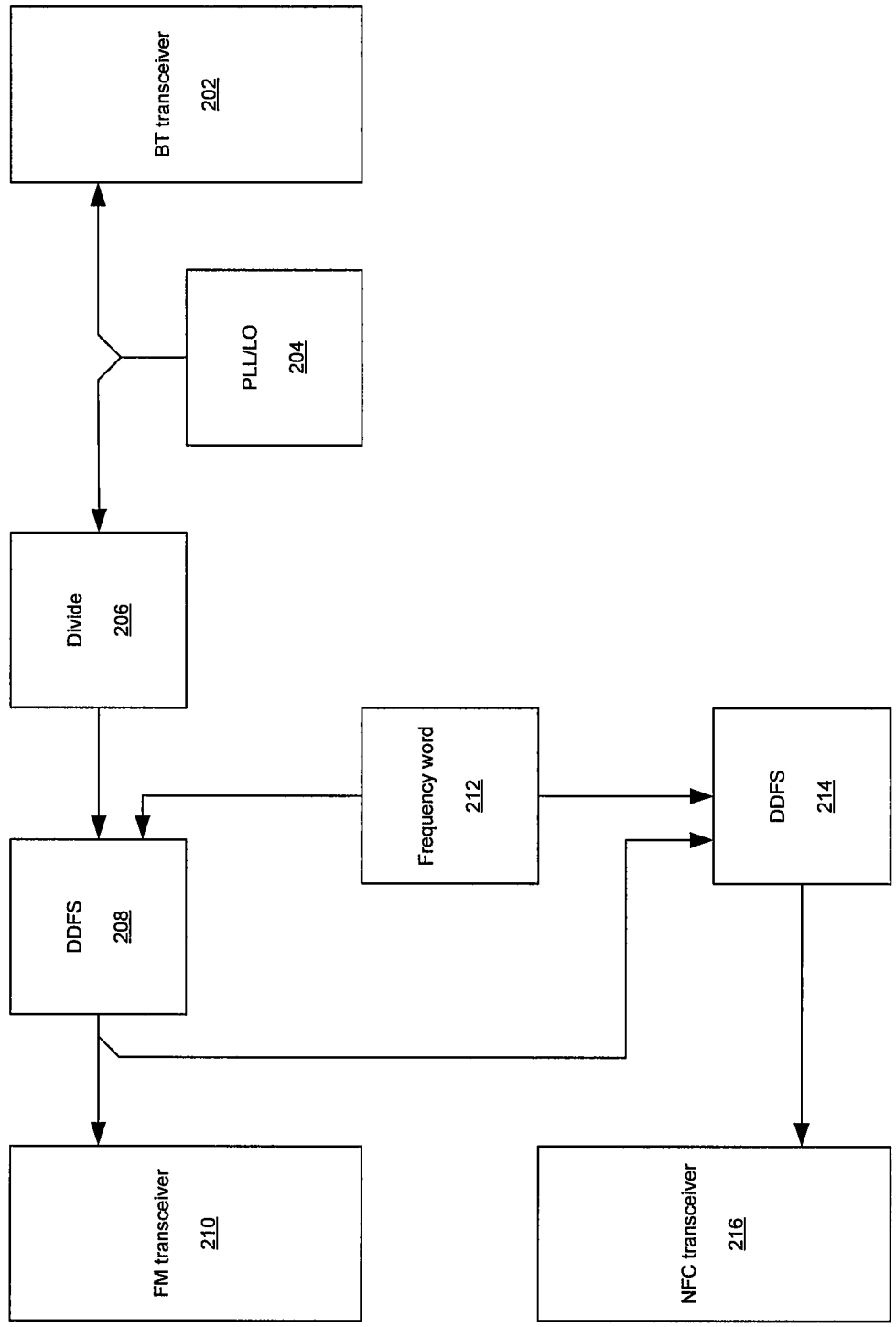
FIG. 2 is a block diagram of an exemplary system for wireless communication using a plurality of communication protocols, in accordance with an embodiment of the invention.

FIG. 2 is a block diagram of an exemplary system for wireless communication using a plurality of communication protocols, in accordance with an embodiment of the invention. Referring to FIG. 2, there is shown a wireless terminal 200 comprising a BT transceiver 202, a PLL 204, a divider block 206, DDFS 208 and 214, a FM transceiver 210, a frequency word control block 212, and a NFC transceiver 216. The BT transceiver 202 may comprise suitable logic, circuitry, and/or code that may enable reception and transmission of Bluetooth signals. The BT transceiver 202 may be similar, for example, to the transceiver 151, 152, and/or 153. Accordingly, the BT transceiver 202 may transmit and receive RF signals at frequencies used for Bluetooth communication.

Similarly, the FM transceiver 210 may transmit and receive RF signals at FM radio spectrum, and the NFC transceiver 216 may transmit and receive RF frequencies used for NFC. The PLL 204 may comprise suitable logic and/or circuitry that may enable generation of a desired local oscillator (LO) signal for use by, for example, a transceiver, such as the BT transceiver 202. The PLL 204 may generate a plurality of LO signals with the same frequency, but different phases. For example, the PLL 204 may generate I and Q signals for use by the Bluetooth transceiver 202. General operation of a PLL is described in more detail with respect to FIG. 4. While a PLL may have been used for exemplary purposes, the invention need not be so limited. For example, the local oscillator circuit that comprises signal generation circuitry may generate the local oscillator signal at a desired frequency, where the local oscillator signal may comprise, for example, I and Q components. The local oscillator frequency may be changed as needed, for example, when frequency hopping is used for Bluetooth transmission.

The divider block 206 may comprise suitable logic, circuitry, and/or code that may enable reducing a frequency of an input signal to an output signal with a desired frequency. The output signal generated by the divider block 206 may be used, for example, as a reference clock for the DDFS 208. The divider block 206 may receive a signal from the PLL 204 having a frequency $F_{BT\_LO}$, and output a signal having a frequency $F_{DIV\_FM}$:

$$F_{DIV\_FM} = \frac{F_{BT\_LO}}{N_{FM}} \quad [1]$$

where $N_{FM}$ may represent a configurable scale factor utilized by the divider block 206. The signal from the PLL 204 may be, for example, an I or Q LO signal.

The DDFS 208 may generate at least one output signal that may be used as a LO signal for transmission and reception of RF signals by the FM transmitter 210. The DDFS 208 may generate, for example, I and Q LO signals for use by the FM transceiver 210. An output of the DDFS 208 may also be used, for example, as a reference clock for the DDFS 214. The reference clock for the DDFS 214 may be, for example, an I or Q LO signal generated by the DDFS 208. The output of the DDFS 214 may be used for transmission and reception of RF signals by the NFC transceiver 216.

The frequency word control block 212 may comprise suitable logic, circuitry, and/or code that may enable generation of frequency word controls for the DDFS 208 and 214. The frequency word controls may be used by the DDFS 208 and 214 to determine the frequency and/or phase of the output signals of the DDFS 208 and 214. The frequency word control block 212 may vary the frequency word controls to the DDFS 208 and 214 depending on the frequency of the input signal and the desired output frequency.

In operation, the PLL 204 may generate appropriate LO signals that may be used for the Bluetooth transceiver 202. The LO signals generated by the PLL 204 may be used for frequency hopping by the Bluetooth transceiver 202. Accordingly, frequencies of the I and O signals may vary 1600 times per second. One of the I and Q signals from the PLL 204 may be communicated to the divider block 206. The signal from the PLL 204 may be divided by the divider block 204 using an appropriate scale factor $N_{FM}$ such that it may be an appropriate reference clock signal for the DDFS 208. The scale factor $N_{FM}$ may be determined by, for example, a processor such as the baseband processor 154 and/or the processor 156.

The signal from the divider block 206 may be communicated to the DDFS 208 as a reference clock. Since the input to the divider block 206 may change as the BT transceiver 202 engages in frequency hopping, the output of the divider block 206 may also change frequencies. Accordingly, the frequency word control block 212 may vary the frequency word control to compensate for the changing input reference clock. Other embodiments of the invention may also control the divider block 206 to change the frequency of its output signal. Accordingly, the DDFS 208 may output a desired frequency by controlling the frequency of the input reference clock signal and the value of the frequency word control. Similarly, the frequency word control to the DDFS 214 may be changed to compensate for the different frequencies that may be generated for the FM transceiver 210 by the DDFS 208.

The digital signals generated by the frequency word control block 212 may comprise control information about the frequency and/or phase of the analog output signal that may be generated by the DDFS 208 and 214. The input clock signals may provide a reference clock that may be N times higher than the frequency that may be generated at the output signal. Using the input clock signals and the information that may be contained in the frequency word controls, the DDFS 208 and 212 may generate one or more analog output signals whose frequencies may be changed.

While each block in FIG. 2 may show a single output signal for simplicity and ease of explanation, the invention need not be so limited. For example, the PLL 204 may output I and Q signals for the BT transceiver 204. Similarly, the outputs of the DDFS 208 and 214 may comprise I and Q signals for the FM transceiver 210 and the NFC transceiver 216, respectively. The input to the divider block 206 may be, for example, one of the I and Q signals. Similarly, the DDFS 208 may generate I and Q signals for the FM transceiver 210, and one of those signals may be communicated to the DDFS 214 as a reference clock.

Additionally, while the divider block 206 may be shown in an embodiment of the invention disclosed with respect to FIG. 2, the invention need not be so limited. For example, a signal that has the same frequency as the output of the PLL 204 may be used as a reference clock for the DDFS 208. In a similar manner, the output of the DDFS 208 may be reduced in frequency by, for example, a divider block similar to the divider block 206 before being used as a reference clock for the DDFS 214.

Figure 3:
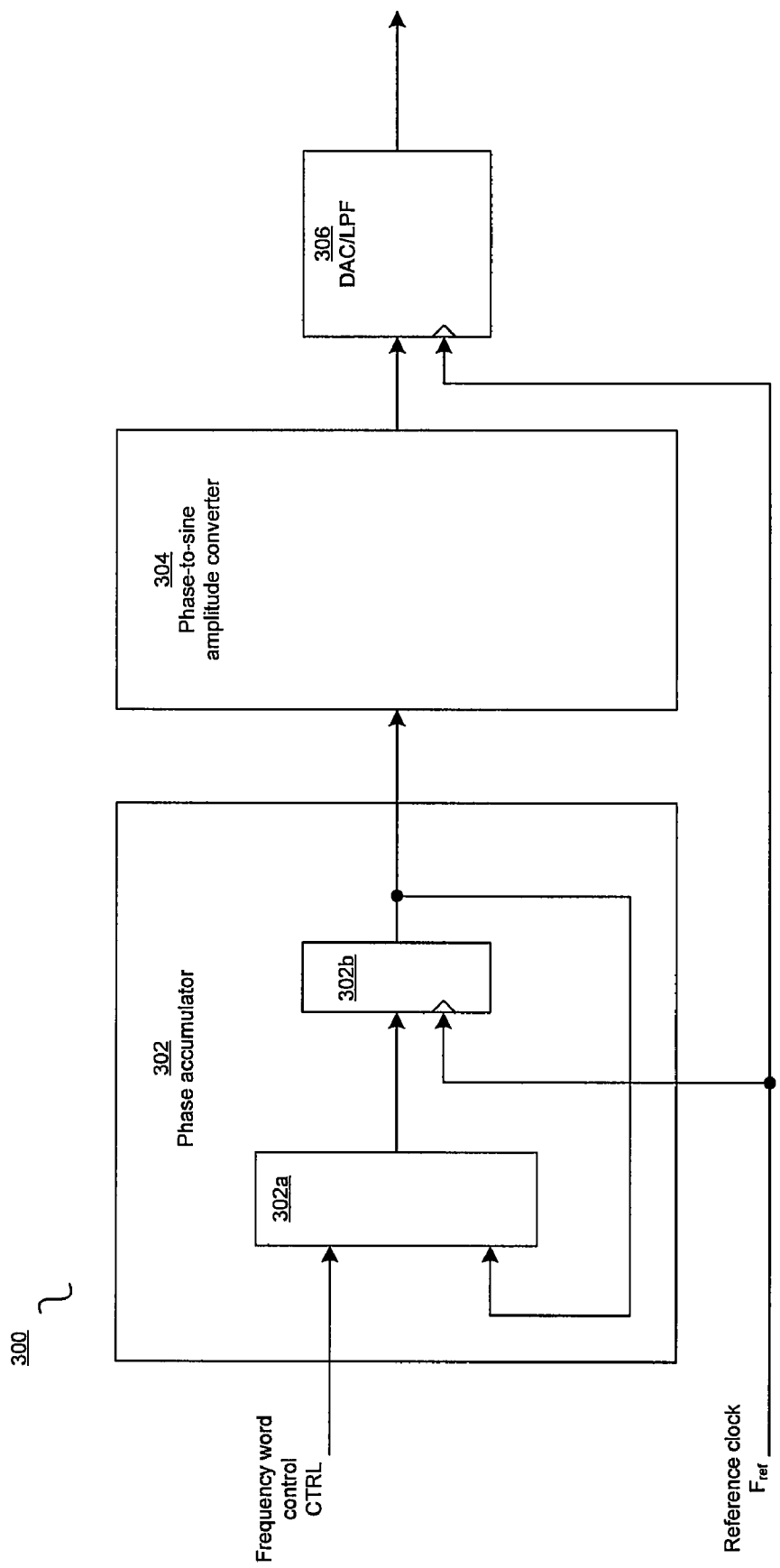
FIG. 3 is a block diagram illustrating an exemplary direct digital frequency synthesizer, in accordance with an embodiment of the invention.

FIG. 3 is a block diagram illustrating an exemplary direct digital frequency synthesizer, in accordance with an embodiment of the invention. Referring to FIG. 3, there is shown a direct digital frequency synthesizer (DDFS) 300 comprising a phase accumulator 302, a phase-to-sine amplitude converter 304, and a digital to analog converter (DAC) 306. The DDFS 300 may be similar in functionality to the DDFS 208 and 214. The phase accumulator 302 may comprise an adder 302a that may enable integrating an input signal, such as, for example, a frequency word control CTRL, by adding it to a previous integrated value stored in a register 302b on each cycle of a reference clock $F_{ref}$. The reference clock $F_{ref}$ may be fixed-frequency or varying frequency. In the case of a varying reference clock $F_{ref}$, the change in frequency may be compensated by altering the frequency word control CTRL such that the output of the DDFS may comprise a desired frequency and/or phase.

The phase-to-sine amplitude converter 304 may comprise suitable logic, circuitry, and/or code that may enable converting the output of the phase accumulator 302 to an approximated sine amplitude. For example, the conversion may be achieved via a look-up table. Although only a single output may be shown for exemplary purposes, a plurality of signals may be generated where each signal may be phase shifted from the others. For example, where I and Q signals may be needed, the phase-to-sine amplitude converter 304 may utilize a plurality of different look-up tables for each input value. In an exemplary embodiment of the invention, a first look-up table may be utilized for the I signal and a second look-up table may be utilized for the Q signal.

The DAC 306 may comprise suitable logic and/or circuitry that may enable converting the digital output of the phase-to-sine amplitude converter 304 to an analog output. The DAC 306 may also comprise, for example, a low-pass filter that may be used to "smooth" the analog output. Where the DDFS 300 may generate, for example, I and Q signals, there may be a DAC for generating an I signal and a DAC for generating a Q signal. Accordingly, the DDFS 300 may be a digitally-controlled signal generator that may vary phase, frequency, and/or amplitude of one or more output signals based on a single reference clock $F_{ref}$ and an input control word CTRL.

In operation, the input control word CTRL may be provided to the adder 302a, and may be successively added to an integrated value stored in the register 302b. The adding may occur, for example, on each cycle of the reference clock $F_{ref}$. In this manner, the sum may eventually be greater than the maximum value the accumulator can store, and the value in the accumulator may overflow or "wrap". Accordingly, an N-bit phase accumulator 302 may overflow at a frequency $F_{out}$ given by the following equation:

$$F_{out}=(F_{ref}*CTRL)/2^N \quad [2]$$

In this manner, the output of the phase accumulator 302, which may be referred to as $F_{out}$, may be periodic at a period of $1/F_{out}$ and may represent the phase angle of a signal. In this regard, the DDFS 300 may operate as a frequency generator that generates one or more sine waves or other periodic waveforms over a large range of frequencies, from almost DC to approximately half the reference clock frequency $F_{ref}$.

Prior to changing the input control word CTRL, the state of the DDFS 300 may be saved in, for example, a memory such as the system memory 158, described with respect to FIG. 1. In this manner, the output signal $F_{out}$ may be interrupted and then resumed without losing the phase information comprising the generated signals. For example, the DDFS 300 may resume generating the output signal $F_{out}$ using the saved state loaded from, for example, the system memory 158. Accordingly, the output signal $F_{out}$ may resume from the last phase angle transmitted before the signal was interrupted.

Figure 4:
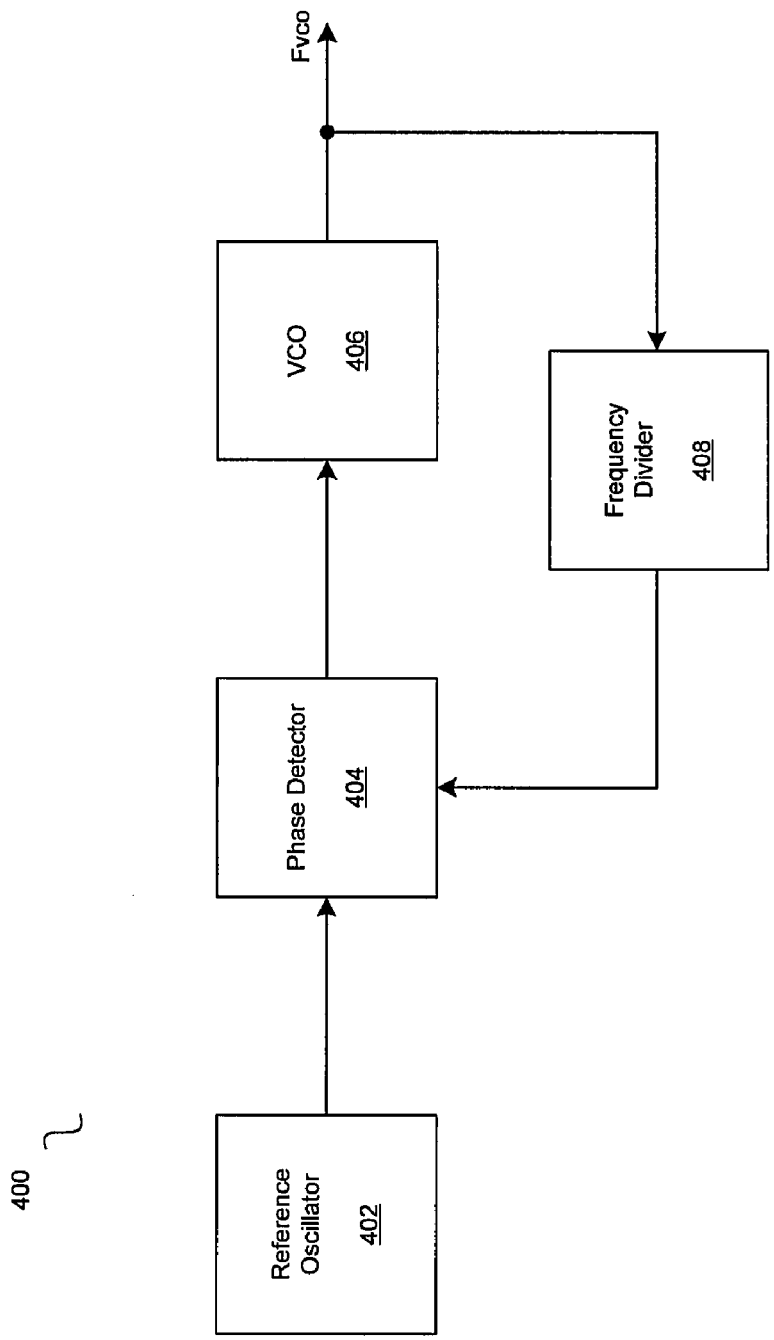
FIG. 4 is a block diagram illustrating an exemplary phase locked loop, in accordance with an embodiment of the invention.

FIG. 4 is a block diagram illustrating an exemplary phase locked loop, in accordance with an embodiment of the invention. Referring to FIG. 4, there is shown a phase locked loop (PLL) 400 comprising a reference oscillator 402, a phase detector 404, a voltage controlled oscillator (VCO) 406, and a frequency divider 408. The PLL 400 may be similar in functionality to the PLL 204.

The reference oscillator 402 may comprise suitable logic and/or circuitry that may be adapted to generate a signal of a fixed frequency. The signal may be utilized as a reference signal for a phased lock loop circuit. This signal may be, for example, a low frequency signal on the order of megahertz or tens of megahertz. The phase detector 404 may comprise suitable logic and/or circuitry that may be adapted to compare two signals and generate an output voltage that may indicate whether the two signals have the same frequency, or whether the frequency of one signal may be larger than the frequency of the other signal.

The voltage controlled oscillator 406 may comprise suitable logic and/or circuitry that may be adapted to generate a signal that may vary in frequency according to an input control voltage. The input control voltage may be communicated by the phase detector 404. The voltage controlled oscillator 406 may be utilized to generate RF carrier signals that may be utilized to upconvert baseband signals to IF or RF signals, or upconvert IF signals to RF signals. The RF carrier signals may also be utilized to downconvert RF signals to IF or baseband signals, or downconvert IF signals to baseband signals.

The frequency divider 408 may comprise suitable logic and/or circuitry that may be adapted to reduce the frequency of an input signal, for example, the output signal, $F_{vco}$, from the voltage controlled oscillator 406, where the reduction may be by an integer factor or a non-integer factor. The output of the frequency divider 408 may be communicated to the phase detector 404. The phase detector 404 may compare the output of the frequency divider 408 and the output of the reference oscillator 402. The phase detector 404 may generate a suitable voltage to communicate to the voltage controlled oscillator 406, which may indicate whether to increase the frequency of the output signal, $F_{vco}$, decrease the frequency of the out put signal, $F_{vco}$, or keep the frequency of the output signal, $F_{vco}$, at the same frequency.

In operation, the frequency divider 408 may divide the output signal, $F_{vco}$, from the voltage controlled oscillator 406 to generate a signal that may be the same frequency as the reference signal generated by the reference oscillator 402. However, if the output signal, $F_{vco}$, is not quite a desired multiple of the reference signal generated by the reference oscillator 402, or if it is an incorrect multiple of the reference signal generated by the reference oscillator 402, the phase detector 404 may generate a control input voltage. The control input voltage may be communicated to the voltage controlled oscillator 406 to drive the frequency of the output signal, $F_{vco}$, to the desired frequency value.

Figure 5:
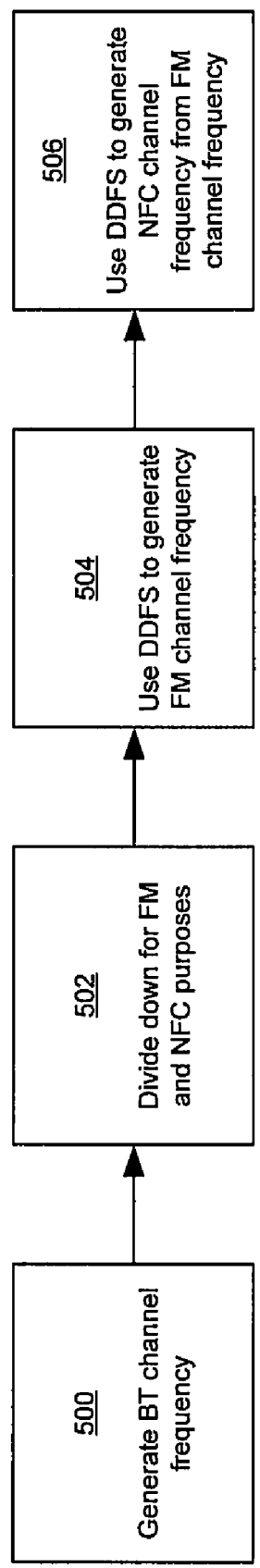
FIG. 5 is a flow diagram illustrating exemplary steps for using direct digital frequency synthesizers with a plurality of communication protocols, in accordance with an embodiment of the invention.

FIG. 5 is a flow diagram illustrating exemplary steps for using direct digital frequency synthesizers with a plurality of communication protocols, in accordance with an embodiment of the invention. Referring to FIG. 5, there are shown steps 500 to 506. In step 500, the PLL 204 may generate a BT frequency for use by the Bluetooth transceiver 202. In step 502, the BT frequency, which may be from 2.402 GHz to 2.480 GHz, may be divided to a lower frequency suitable for use by a DDFS. For example, the divider block 206 may provide a lower frequency signal by dividing the input signal from the PLL 204.

In step 504, the DDFS 208 may be communicated an appropriate frequency control word by the frequency control word block 212. The frequency control word generated by the frequency control word block 212 may depend on, for example, the output frequency of the divider block 206 and the desired frequency of the signal for the FM transceiver 210. In step 506, the DDFS 214 may be communicated an appropriate frequency control word by the frequency control word block 212. The frequency control word generated by the frequency control word block 212 may depend on, for example, the output frequency of the DDFS 208 and the desired frequency of the signal for the NFC transceiver 216.

Figure 6:
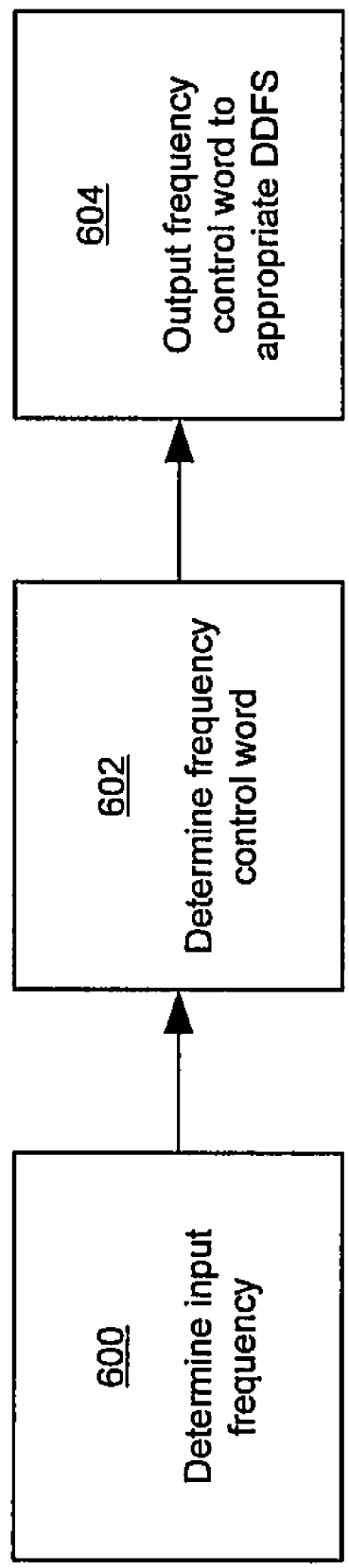
FIG. 6 is a flow diagram illustrating exemplary steps for using direct digital frequency synthesizers, in accordance with an embodiment of the invention.

FIG. 6 is a flow diagram illustrating exemplary steps for using direct digital frequency synthesizers, in accordance with an embodiment of the invention. Referring to FIG. 6, there are shown steps 600 to 604. In step 600, an input frequency may be determined. The input frequency determination may be made by a processor such as, for example, the baseband processor 154 and/or the processor 156. In step 602, a frequency control word may be determined for use by a DDFS to generate a desired output frequency. A processor such as, for example, the baseband processor 154 and/or the processor 156 may determine the proper output frequency. The frequency word control block 212 may then determine an appropriate frequency word control to communicate to the appropriate DDFS. The frequency word may be based on, for example, the width in bits of the frequency word control block 212, the frequency of the reference clock for the appropriate DDFS, and the output frequency desired. In step 604, the frequency control word may be communicated to the appropriate DDFS.

In accordance with an embodiment of the invention, aspects of an exemplary system may comprise, on a chip, the PLL 204 that may generate Bluetooth signal, which may comprise, for example, I and Q components, or the Bluetooth I and Q LO signals, for the Bluetooth transceiver 202. A signal from the PLL 204, which may, for example, have a same frequency as the Bluetooth I or Q LO signals, or is one of the Bluetooth I or Q LO signals, may be communicated to the divider block 206. The divider block 206 may reduce the frequency of the input signal by a factor that may be determined by, for example, the baseband processor 154 and/or the processor 156.

The output of the divider block 206 may be communicated to the DDFS 208 as a reference clock. The DDFS 208 may further reduce the frequency of the signal from the divider block 206 to generate, for example, FM I and Q LO signals for the FM transceiver 210. A signal from the DDFS 208, which may be, for example, a same frequency as the FM I and Q LO signals, or is one of the FM I or Q LO signals, may be communicated to the DDFS 214 as a reference clock. The DDFS 214 may then use the signal from the DDFS 208 to generate at least one LO signal for use by the near field communication transceiver 216.

Since the DDFS 208 may generate signals with a single frequency at a given time, the FM transceiver 210 may operate in a half-duplex mode. The FM transmit frequency and the FM receive frequency may comprise different frequencies. Similarly, since the DDFS 214 may generate signals with a single frequency at a given time, the near field communication transceiver 216 may operate in half-duplex mode. By effectively controlling the DDFS 208 and 214, a simultaneous transmission and reception of FM signals and NFC signals, respectively, may be simulated. Time division duplexing of transmission of FM signals and reception of FM signals may be performed by switching the frequency control words between a plurality of values in successive time intervals. Similarly, there may be time division duplexing of NFC signals.

Additionally, the signals generated by the PLL 204 may vary in frequency as may be needed for Bluetooth frequency hopping. Accordingly, the output of the divider block 206 may also vary in frequency. The DDFS 208 may be controlled to output a constant frequency by communicating appropriate frequency word controls from the frequency word control block 212. Similarly, the FM transceiver 210 may require different frequency LO signals from the DDFS 208 for tuning to different channels for transmission and/or reception. Accordingly, the DDFS 214 may be controlled to output a constant frequency by communicating appropriate frequency word controls from the frequency word control block 212. Accordingly, the outputs of the DDFS 208 and 214 may be controlled to compensate for changes in the reference clock frequencies.

While the divider block 206 may be used in an embodiment of the invention, the invention need not be so limited. For example, other embodiments of the invention may not use the divider block 206. Rather, the Bluetooth LO signal, or another signal of the same frequency as the Bluetooth LO signal, may be used to clock the DDFS 208. Similarly, various embodiments of the invention may use circuitry similar to the divider block 206 to generate a reference clock for the DDFS 214 that may have a lower frequency than the FM I and Q LO signals.

Another embodiment of the invention may provide a machine-readable storage, having stored thereon, a computer program having at least one code section executable by a machine, thereby causing the machine to perform the steps as described above for clocking FM transmit, FM receive and near field communication functions using DDFS.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. A method for wireless communication, comprising:
   generating a first signal to process one or both of Bluetooth protocol transmission signals and Bluetooth protocol reception signals;
   generating a second signal based on the first signal, wherein the second signal is utilized to clock a first direct digital frequency synthesizer (DDFS) associated with a first wireless protocol different from the Bluetooth protocol; and
   generating a third signal based on the second signal, wherein the third signal is utilized to clock a second DDFS associated with a second wireless protocol different from the Bluetooth protocol.

2. The method of claim 1, wherein the first wireless protocol is an FM radio protocol.

3. The method of claim 2, wherein transmission in the FM radio protocol is associated with a frequency that is different from a frequency associated with reception in the FM radio protocol.

4. The method of claim 1, wherein the second wireless protocol is a near field communication (NFC) protocol.

5. The method of claim 1, comprising generating one or more frequency control words that control the first DDFS and the second DDFS.

6. The method of claim 4, comprising adjusting the one or more frequency control words to compensate for changes in a frequency of the first signal.

7. The method of claim 1, wherein the first signal comprises an in-phase (I) component and a quadrature (Q) component.

8. The method of claim 1, wherein the second signal is associated with a frequency that is equal to or less than a frequency associated with the first signal.

9. The method of claim 1, wherein the first DDFS is operable to generate an output signal associated with a constant frequency while a frequency associated with the first signal is variable.

10. The method of claim 1, wherein the second DDFS is operable to generate an output signal associated with a constant frequency while a frequency associated with an output signal of the first DDFS is variable.

11. A system for wireless communication, comprising:
    one or more circuits operable to generate a first signal to process one or both of Bluetooth protocol transmission signals and Bluetooth protocol reception signals;
    the one or more circuits are operable to generate a second signal based on the first signal, wherein the second signal is utilized to clock a first direct digital frequency synthesizer (DDFS) associated with a first wireless protocol different from the Bluetooth protocol; and
    the one or more circuits are operable to generate a third signal based on the second signal, wherein the third signal is utilized to clock a second DDFS associated with a second wireless protocol different from the Bluetooth protocol.

12. The system of claim 11, wherein the first wireless protocol is an FM radio protocol.

13. The system of claim 12, wherein transmission in the FM radio protocol is associated with a frequency that is different from a frequency associated with reception in the FM radio protocol.

14. The system of claim 11, wherein the second wireless protocol is a near field communication (NFC) protocol.

15. The system of claim 11, wherein the one or more circuits are operable to generate one or more frequency control words that control the first DDFS and the second DDFS.

16. The system of claim 14, wherein the one or more circuits are operable to adjust the one or more frequency control words to compensate for changes in a frequency of the first signal.

17. The system of claim 11, wherein the first signal comprises an in-phase (I) component and a quadrature (Q) component.

18. The system of claim 11, wherein the second signal is associated with a frequency that is equal to or less than a frequency associated with the first signal.

19. The system of claim 11, wherein the first DDFS is operable to generate an output signal associated with a constant frequency while a frequency associated with the first signal is variable.

20. The system of claim 11, wherein the second DDFS is operable to generate an output signal associated with a constant frequency while a frequency associated with an output signal of the first DDFS is variable.

* * * * *